(12) United States Patent
Ose

(10) Patent No.: US 7,060,944 B2
(45) Date of Patent: Jun. 13, 2006

(54) HEAT TREATMENT DEVICE AND HEAT TREATMENT METHOD

(75) Inventor: Hiroki Ose, Nishishirakawa-gun (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 10/500,122

(22) PCT Filed: Jan. 22, 2003

(86) PCT No.: PCT/JP03/00558

§ 371 (c)(1),
(2), (4) Date: Jun. 25, 2004

(87) PCT Pub. No.: WO03/073486

PCT Pub. Date: Sep. 4, 2003

(65) Prior Publication Data

US 2005/0106524 A1 May 19, 2005

(30) Foreign Application Priority Data

Jan. 23, 2002 (JP) ............................. 2002-014715

(51) Int. Cl.
H05B 3/68 (2006.01)
(52) U.S. Cl. .................................... 219/444.1; 118/724
(58) Field of Classification Search ............. 219/443.1, 219/444.1, 390; 392/416, 418; 118/724, 118/725; 438/694, 695; 216/55, 58, 63, 216/66
See application file for complete search history.

(56) References Cited

U.S. PATENT DOCUMENTS 5,421,957 A * 6/1995 Carlson et al. ................ 216/58
6,022,587 A * 2/2000 Hey et al. ................. 427/248.1
6,153,260 A * 11/2000 Comita et al. ......... 427/255.23
6,489,241 B1 * 12/2002 Thilderkvist et al. ....... 438/689

* cited by examiner

Primary Examiner—Sang Paik
(74) Attorney, Agent, or Firm—Oliff & Berridge, PLC

(57) ABSTRACT

A heat treatment apparatus (100) having: a susceptor (2) rotatably provided in a heat treatment vessel (1), on which a wafer (W) is placed; a preheat ring (3) surrounding a periphery of the susceptor (2) to be close to and in non-contact with the susceptor, which is supported by a base (4) provided in the heat treatment vessel (1); and a heating apparatus (8) for heating a wafer (W) placed on the susceptor (2), wherein the preheat ring (3) is formed such that an inner peripheral center (31a) is eccentric to an outer periphery (32). The preheat ring (3) is moved around the susceptor (2); the preheat ring (3) is positioned to minimize a distance between the inner peripheral center (31a) of the preheat ring (3) and the center (2b) of the susceptor (2); and thereafter a heat treatment is performed to a wafer (W).

8 Claims, 6 Drawing Sheets

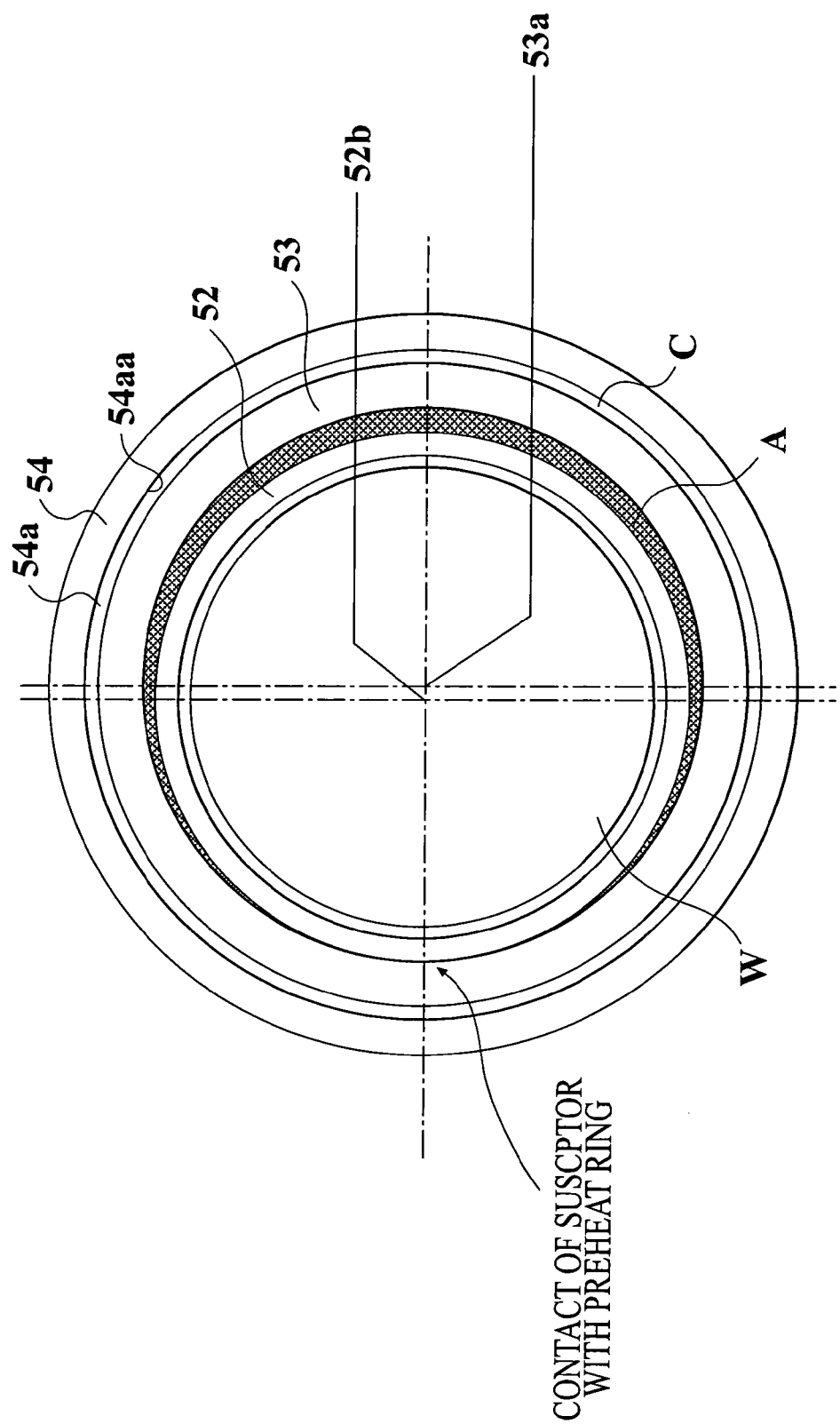

US 7,060,944 B2

HEAT TREATMENT DEVICE AND HEAT TREATMENT METHOD

FIELD OF THE INVENTION

This invention relates to a heat treatment apparatus and a heat treatment method for performing a heat treatment to a substrate.

BACKGROUND ART

Recently, a heat treatment apparatus has been used for processes such as forming a thin film, e.g., a silicon epitaxial layer, a silicon nitride film or the like on a front surface of a semiconductor substrate such as a silicon single crystal wafer (hereinafter, referred as wafer) or the like, performing etching thereto or the like.

The heat treatment apparatus comprises, for example, a translucent heat treatment vessel made from quartz or the like, and a susceptor is provided inside thereof for placing and rotating a wafer. A heating apparatus comprising a halogen lamp or the like is provided around the heat treatment vessel so that a wafer placed on the susceptor can be heated from the outside of the heat treatment vessel. Further, a gas supply opening for supplying reaction gas or the like into the heat treatment vessel and a gas exhaust opening are formed at a side portion of the heat treatment vessel, and the heat treatment apparatus is provided with a gas supply apparatus or the like, thereby enabling to supply various reaction gases or the like from the gas supply opening into the heat treatment vessel with predetermined composition and flow rate.

A preheat ring is provided in the heat treatment vessel to surround the side periphery of the susceptor, for preferably performing heat treatment with an in-plane temperature distribution of a wafer W uniformed (for example, Japanese Patent Application Laid Open No. 78863/1995)). The preheat ring is, for example, as a preheat ring 53 shown in FIG. 5, formed in a ring shape with a predetermined width to surround the outer periphery of the susceptor 52, and is supported by a base 54 provided on the side of the susceptor 52 in the heat treatment vessel. FIG. 5A is a top view, and FIG. 5B is a sectional view taken along the line B-B' of FIG. 5A. The preheat ring 53 is placed on a pocket 54a of the base 54.

The preheat ring 53 is heated together with the wafer W placed on the susceptor 52 by the heating apparatus in heat treatment. For example, in a cold wall type heat treatment apparatus, the heat treatment vessel is cooled by a cooling section for preventing polysilicon or the like from depositing on the inside of the heat treatment apparatus during heat treatment, however, because the preheat ring 53 surrounds the periphery of the susceptor 52, it can be prevented that the temperature at a portion around the wafer W placed on the susceptor 52 is decreased by the effect of the cooled heat treatment vessel. Also, since gas supplied from the gas supply opening into the heat treatment vessel passes over the preheat ring 53 to reach wafer W, the gas is appropriately heated, enabling to preferably perform heat treatment.

Preferably, the preheat ring 53 is, for the purpose thereof, provided as close to the susceptor 52 as possible, while it is required not to contact with the susceptor 52 because the susceptor 52 rotates inside the heat treatment vessel in heat treatment. Therefore, there is a slight clearance A provided between the susceptor 52 and the preheat ring 53.

For preventing the preheat ring 53 from moving on the base 54 by thermal expansion to thereby contact with the susceptor 52, there is a slight clearance C provided between an inner periphery 54aa of the pocket 54 and the preheat ring 53, and the width of the clearance C is set to be within a predetermined range in view of the movement of the preheat ring 53 by thermal expansion.

However, although the heat treatment apparatus is designed such that the susceptor 52 and the preheat ring 53 are concentric with each other as shown in FIGS. 5A and 5B, a center 52b of the susceptor 52 may be slightly misaligned relative to a center 53a of the preheat ring 53 as shown in FIG. 6 due to error in accuracy of each member forming the heat treatment apparatus and assembling accuracy. Specially, in a case of a heat treatment apparatus for processing a wafer with large diameter, a misalignment of about 1 to 2 mm would occur, thereby the susceptor 52 may contact with the preheat ring 53.

Occurrence of such the contact would generate a large amount of particles because the susceptor 52 and the preheat ring 53 rub each other during heat treatment, which adhere to the wafer to cause crystal defect, resulting in lowering of yield.

Although the preheat ring 53 is moved in the pocket 54a of the base 54 depending upon a misalignment of the susceptor 52 for preventing such the contact, the clearance C between the inner periphery 54aa of the pocket 54a and the preheat ring 53 is limited as described above. When the inner diameter of the preheat ring 53 is enlarged, the distance between the preheat ring 53 and the susceptor 52 becomes large, thereby obstructing to sufficiently fulfill the function, which is disadvantageous.

Accordingly, for avoiding the contact of the susceptor 52 with the preheat ring 53, operations such as adjusting a support section or the like of the susceptor are needed, which are extremely cumbersome and require a lot of time. Specially, after maintenance such as cleaning of the heat treatment vessel or the like, it would take a considerable amount of time for adjusting the susceptor 52 and the preheat ring 53, which is causative of long non-operating time.

An object of this invention is to provide a heat treatment apparatus and a heat treatment method, in which a contact of a susceptor with a preheat ring can be easily prevented, and generation of particles can be reduced to preferably perform heat treatment.

DISCLOSURE OF THE INVENTION

In order to solve the above described problem, in accordance with a first aspect of this invention, in the heat treatment apparatus of this invention, the heat treatment apparatus (100) comprises: a susceptor (2) rotatably provided in a heat treatment vessel (1), on which a substrate is placed; a preheat ring (3) surrounding a periphery of the susceptor to be close to and in non-contact with the susceptor, which is supported by a support section (for example, a base 4) provided in the heat treatment vessel; and a heating apparatus (8) for heating the substrate (wafer W) placed on the susceptor, wherein the preheat ring is formed such that an inner peripheral center (31a) is eccentric to an outer periphery (32) of the preheat ring.

According to the heat treatment apparatus of this invention, since the inner peripheral center of the preheat ring is formed to be eccentric to the outer periphery of the preheat ring, even when the susceptor is misaligned relative to the support section for the preheat ring, the preheat ring can be positioned to minimize the distance between the center of the susceptor and the inner peripheral center of the preheat ring to be supported by the support section, thereby enabling to form a proper clearance between the surrounding of the susceptor and the preheat ring. Thus, contact of the susceptor with the preheat ring can be prevented.

Accordingly, generation of particles caused by the contact of the susceptor with the preheat ring during heat treatment can be prevented, so that particles adhering to the substrate can be reduced, thereby suppressing lowering of yield. Also, this invention is preferable because the preheat ring can be easily adjusted not to contact with the susceptor, and therefore the non-operating time required for the adjustment or the like after maintenance of the heat treatment apparatus can be shortened.

In the heat treatment apparatus of this invention, preferably, the support section comprises a base (4) on which a pocket (4a) for placing the preheat ring is formed.

According to the heat treatment apparatus, together with the above described effects, by making the base on which the pocket is formed support the preheat ring, the outer periphery of the preheat ring can be easily positioned by the pocket of the base, and also even when the center of the susceptor is misaligned, the preheat ring is rotated in a peripheral direction or moved in the base to minimize the distance between the center of the susceptor and the inner peripheral center of the preheat ring, so that the preheat ring can be easily adjusted not to contact with the susceptor.

Further, more preferably, the inner peripheral center of the preheat ring corresponds to the center of the susceptor. Also, preferably, a size of an outer diameter of the preheat ring and a size the pocket of the base are set to form a predetermined clearance between a pocket inner periphery of the base and an outer periphery of the preheat ring.

In accordance with a second aspect of this invention a heat treatment method of this invention comprises: moving the preheat ring, which is supported by the support section in the heat treatment apparatus of the first aspect, around the susceptor; positioning the preheat ring to minimize a distance between the inner peripheral center of the preheat ring and the center of the susceptor; thereafter, placing a substrate on the susceptor; and performing a heat treatment to the substrate.

According to the heat treatment method of this invention, the substrate is subjected to heat treatment after positioning the preheat ring by moving the preheat ring supported by the support section around the susceptor, so that the preheat ring does not contact with the susceptor, suppressing generation of particles, and thereby enabling to preferably perform heat treatment to the substrate.

The support section of the preheat ring in this heat treatment method may be the base on which the pocket is formed, like the support section of the heat treatment apparatus of the first aspect. In this case, the preheat ring can be positioned by rotating the preheat ring placed on the base in the peripheral direction or moving the preheat ring in the pocket so as to minimize the distance between the inner peripheral center of the preheat ring and the center of the susceptor, and thereafter, heat treatment is performed to the substrate placed on the susceptor, so that the preheat ring does not contact with the susceptor, suppressing generation of particles, and thereby enabling to preferably perform heat treatment to the substrate.

BRIEF DESCRIPTION OF THE DRAWINGS

FIG. 6 is a top view showing a state that the center of the susceptor is misaligned to the center of the pocket of the base of the preheat ring, and the preheat ring contacts with the susceptor, in the conventional heat treatment apparatus.

BEST MODE FOR CARRYING OUT THE INVENTION

Hereinafter, embodiments according to this invention will be described with reference to the drawings.

Figure 1:
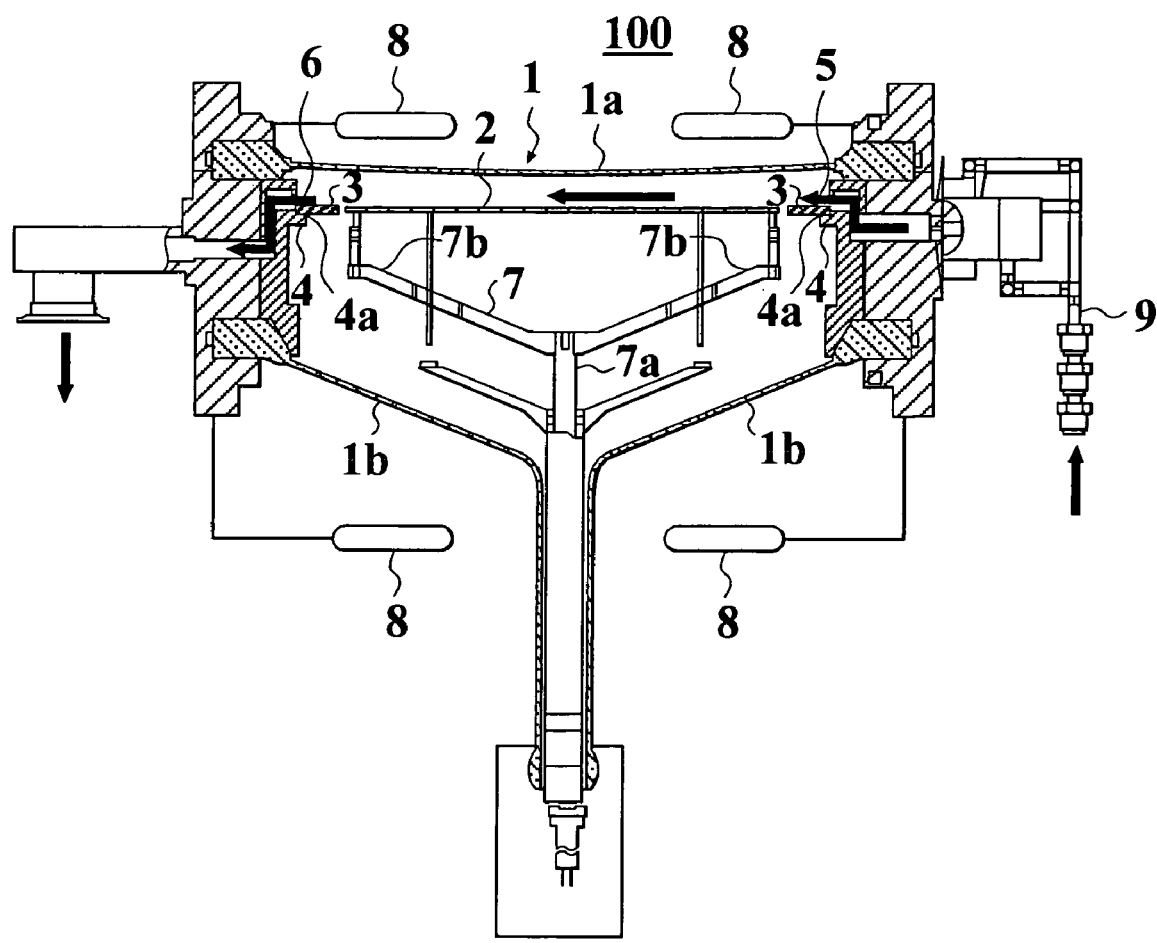
FIG. 1 is a partially sectional schematic view showing a heat treatment apparatus applying this invention.
Figure 2:
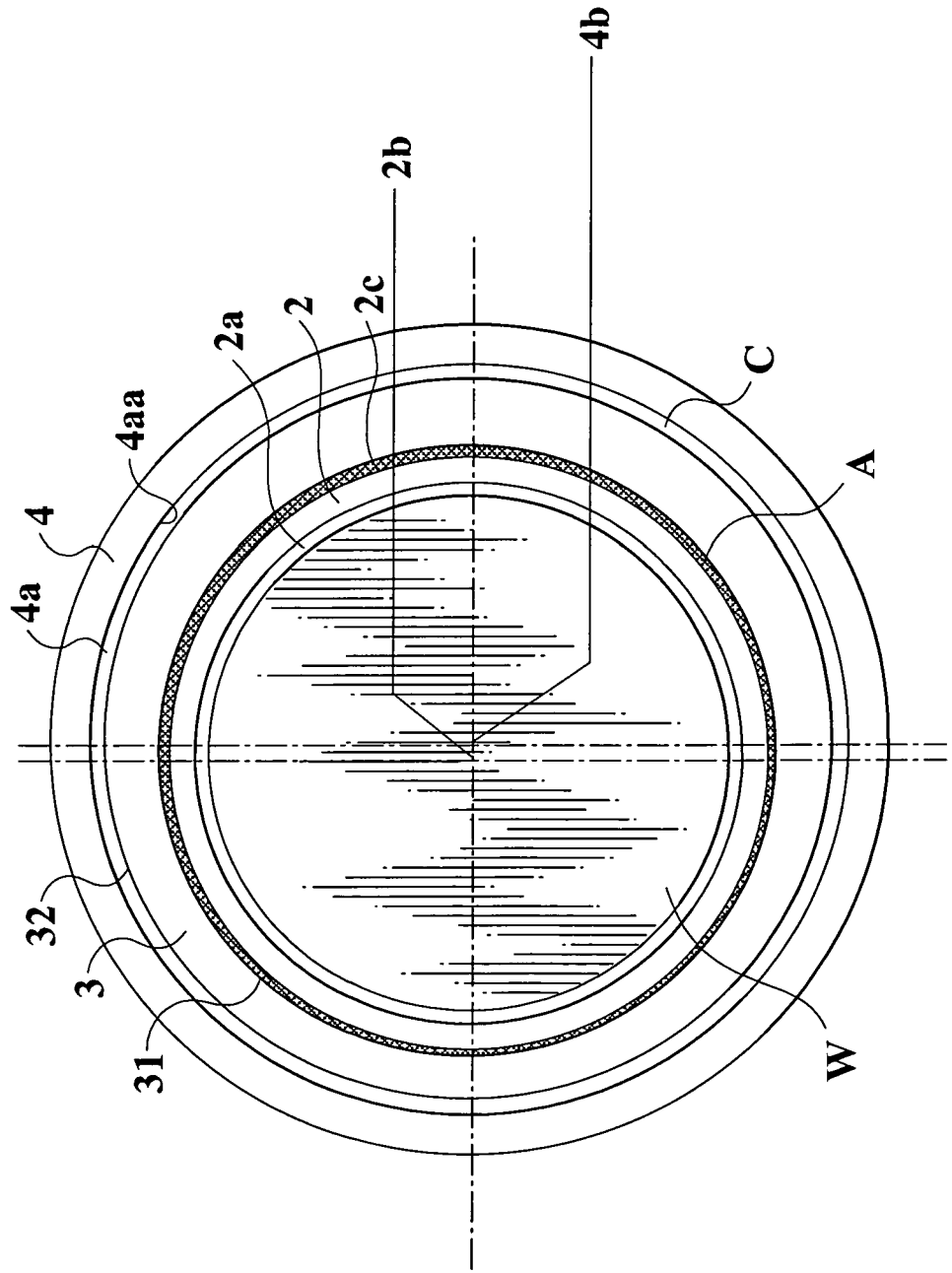
FIG. 2 is a top view showing a state that a preheat ring is provided around a susceptor in a heat treatment apparatus in which a center of the susceptor is misaligned to a center of a pocket of a base.

FIG. 1 is a schematic view showing a single wafer type heat treatment apparatus 100 as one example of this invention, and FIG. 2 is a top view showing a susceptor 2, a preheat ring 3 and a base 4 provided in the heat treatment apparatus 100. The heat treatment apparatus 100 is an apparatus to perform processes associated with heating such as vapor phase epitaxial growth, silicon nitride film formation or the like on a front surface of a substrate such as a silicon single crystal wafer (wafer W) or the like one by one.

As shown in FIG. 1, the heat treatment apparatus 100 is provided with a heat treatment vessel 1 for performing heat treatment to the wafer W. A top wall 1a and a bottom wall 1b of the heat treatment vessel 1 are made from translucent quartz. A gas supply opening 5 is formed on one side of the heat treatment vessel 1 for supplying reaction gas into the heat treatment vessel 1, and a gas exhaust opening 6 is formed on the other side thereof for exhausting gas from the heat treatment vessel 1.

The heat treatment vessel 1 comprises a susceptor 2 inside thereof, which is formed by performing coating of silicon carbide (SiC) on graphite. As shown in FIG. 2, an approximately circular shaped pocket 2a is formed on the front surface of the susceptor 2 for placing the wafer W in an approximately horizontal direction. An outer peripheral center of the susceptor 2 (identical to the center of the pocket 2a) is designated by the reference numeral 2b.

The susceptor 2, as shown in FIG. 1, is supported by a support member 7 from a lower side. The support member 7 mainly comprises a rotary shaft 7a extending in a vertical direction at the lower side of the susceptor 2, spokes 7b radially branching from a top end portion of the rotary shaft 7a, the tip portions of the spokes 7b supporting a rear surface of the susceptor 2. Coupled to the rotary shaft 7a is a rotary driving section which is not shown, and the susceptor 2 is provided to be supported by the support member 7 to be rotatable around the center 2b in the heat treatment vessel 1.

The heat treatment vessel 1 is provided with heating apparatuses 8 comprising a halogen lamp or the like at the lower and upper sides, so that the wafer W placed on the susceptor 2 can be heated. The heat treatment apparatus 100 also comprises a gas supply apparatus (not shown) or the like for supplying various reaction gases or the like into the heat treatment vessel 1 with predetermined composition and flow rate, and gas can be supplied to the heat treatment vessel 1 through a gas supply pipe 9 or the like.

The base 4 (support section) is provided on the side of the susceptor 2 in the heat treatment vessel 1 to surround the periphery of the susceptor 2, and a pocket 4a for placing the preheat ring 3 is formed on an upper portion.

The preheat ring 3 is a ring shaped member formed by performing coating of silicon carbide (SiC) on graphite, and is placed (supported) on the pocket 4a of the base 4 in the heat treatment vessel 1 to surround the side periphery of the susceptor 2. An inner periphery and an outer periphery of the preheat ring 3 are designated by the reference numerals 31, 32, respectively.

The preheat ring 3 expands with heat in heat treatment, so that the size of the outer diameter of the preheat ring 3 (and the size of the pocket 4a of the base 4) is set to make a predetermined clearance C between a pocket inner periphery 4aa of the base 4 and the outer periphery 32 of the preheat ring 3 in a state that the preheat ring 3 is placed. Hereupon, since the preheat ring 3 is placed in the pocket 4 according to the center of the susceptor 2, it would cause bias in the width of the clearance C in the periphery of the preheat ring 3. In the case that bias is caused in the width of the clearance C in the periphery of the preheat ring 3 as described above, setting the width of the clearance C to be small would cause the thermal expanded preheat ring 3 to contact with the pocket inner periphery 4aa at a portion where the width of the clearance C is narrow, misaligning the preheat ring 3, and resulting in contacting with the susceptor 2. On the other hand, when the width of the clearance C between the pocket inner periphery 4aa and the preheat ring 3 is too large, there is a difficulty in positioning the preheat ring 3 on the base 4. Thus, considering that the preheat ring 3 expands about 1.5 to 2.5 mm with heat in heat treatment, the size of the clearance C between the preheat ring 3 and the pocket inner periphery 4aa is preferably about 2.0 mm, and the outer diameter of the preheat ring 3 is set in view of the range of the clearance C.

The preheat ring 3 is provided adjacent to the susceptor 2 to have a predetermined clearance A to the periphery of the susceptor 2 to avoid contacting with the susceptor 2, in the state of being supported by the base 4. When the clearance A between the susceptor 2 and the preheat ring 3 is too large, the distance to the susceptor 2 becomes large, thereby obstructing to sufficiently fulfill the function of the preheat ring 3 such as preventing a decrease in the temperature around the wafer W. Accordingly, the width of the clearance A is preferably about 1.0 to 2.5 mm, and the inner diameter of the preheat ring 3 is set in view of the clearance A.

Hereupon, the heat treatment apparatus 100 is designed such that the center 2b of the susceptor 2 corresponds to the inner peripheral center 4b of the pocket 4a of the base 4, and the outer periphery of the susceptor 2 and the pocket inner periphery 4aa of the pocket 4 are concentric with each other. However, as shown in FIG. 2, a slight misalignment between the center 2b of the susceptor 2 and the inner peripheral center 4b of the pocket 4a of the base 4 would be generated due to error in accuracy of each member forming the heat treatment apparatus 100 and assembling accuracy or the like.

Figure 3:
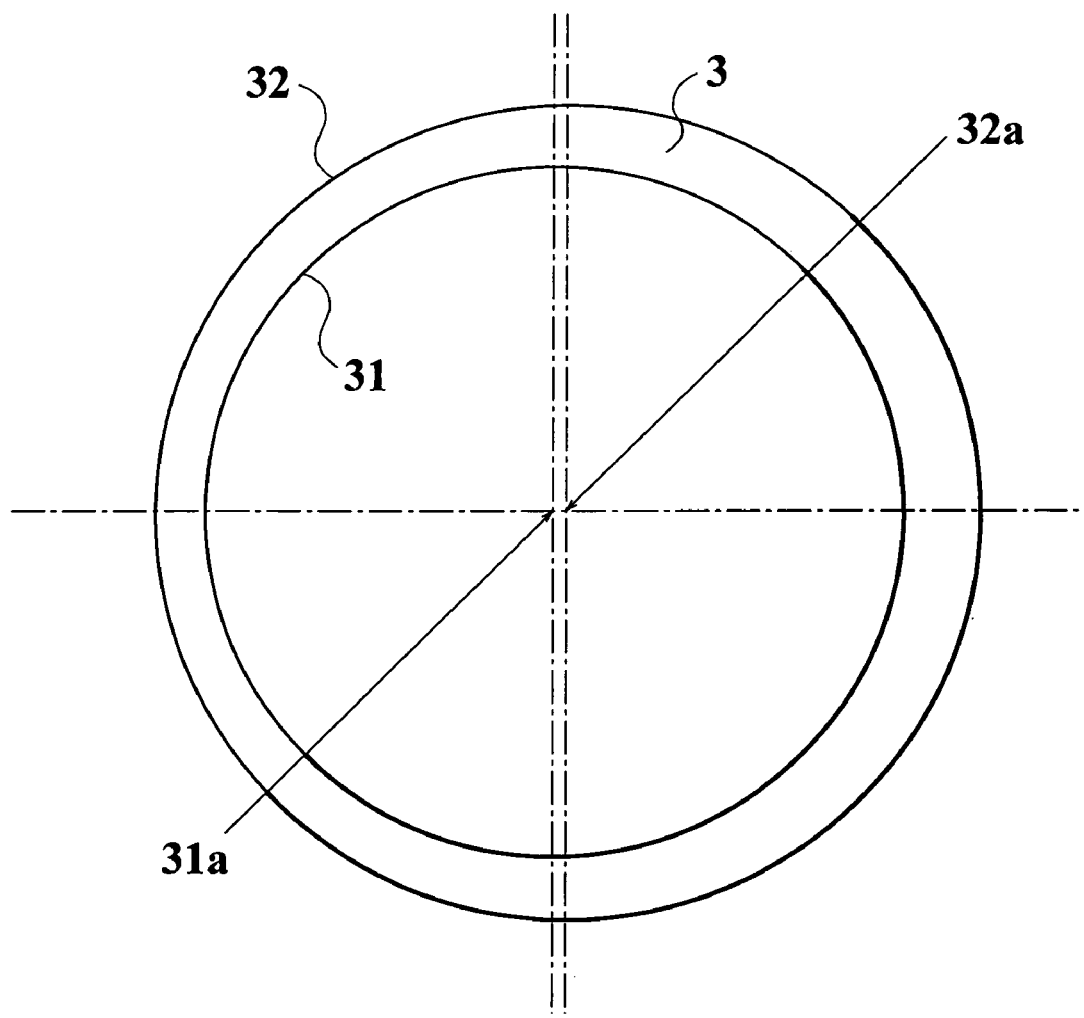
FIG. 3 is a top view of the preheat ring provided in the heat treatment apparatus of this invention.

Thus, as shown in FIG. 3, the preheat ring 3 is formed such that an inner peripheral center 31a is misaligned to an outer peripheral center 32a, that is, the preheat ring 3 has a shape in which the inner peripheral center 31a is eccentric to an outer periphery 32.

A degree of eccentricity of the inner peripheral center 31a of the preheat ring 3 with respect to the outer periphery 32 is arbitrary set because a degree of misalignment between the susceptor 2 and the base 4 is different depending upon an individual heat treatment apparatus.

As an example, in a single wafer type heat treatment apparatus for processing a wafer W of 300 mm in diameter, in a case that a heat treatment apparatus is such that the diameter of the outer periphery of the susceptor 2 is about 373 mm, the diameter of the pocket inner periphery 4aa of the base 4 is about 447 mm, the inner diameter and the outer diameter of the preheat ring are about 377 mm and 443 mm, respectively, the center 2b of the susceptor 2 is often misaligned by 1 to 2 mm to the inner peripheral center 4b of the pocket 4a of the base 4. Accordingly, a preheat ring which is formed such that the inner peripheral center is misaligned by 1 to 2 mm to the outer peripheral center can be used in this type of heat treatment apparatus.

Also, in a case of a heat treatment apparatus for processing a wafer W having other size, the preheat ring can be formed in view of a degree of misalignment of the susceptor to the base.

For attaching the preheat ring 3 onto the base 4, after placing the preheat ring 3 on the base 4, the outer peripheral portion of the preheat ring 3 is positioned with respect to the base 4 to have the above described clearance C to the pocket inner periphery 4aa over the whole periphery of the preheat ring 3. In a case that a portion of the preheat ring 3 contacts with the pocket inner periphery 4aa, the preheat ring 3 would expand with heat in heat treatment, thereby shifting toward the susceptor 2.

Also, the direction of the preheat ring 3 in a peripheral direction is set to minimize the distance between the inner peripheral center 31a of the preheat ring 3 and the center 2b of the susceptor 2. By positioning the preheat ring 3 in the peripheral direction in such the manner, the outer periphery of the susceptor 2 can be more nearly concentric with the inner periphery 31 of the preheat ring 3, enabling to form the clearance A between the susceptor 2 and the preheat ring 3 more uniformly over the whole periphery of the susceptor 2, and to make the preheat ring 3 and the susceptor 2 be in a non-contact state more preferably. Most preferably, the inner peripheral center 31a of the preheat ring 3 corresponds to the center 2b of the susceptor 2.

Explanation of the heat treatment method by the heat treatment apparatus 100 will be made.

First, the preheat ring 3 is placed on the base 4 in the heat treatment vessel 1, and is positioned with respect to the pocket inner periphery 4aa of the base 4 and the susceptor 2 as described above.

Then, a wafer W is placed on the susceptor 2 in the heat treatment vessel 1 to perform heat treatment. The heat treatment is performed such that the susceptor 2 on which the wafer W is placed is rotated in the peripheral direction, and the wafer W and the preheat ring 3 are heated to a predetermined temperature by the heating apparatuses 8. Then, reaction gas is made to flow from the side of the gas supply opening 5 in a direction of the gas exhaust opening 6 with predetermined composition and flow rate, so that the gas flows on a surface of the wafer W.

For example, supplied onto the heated wafer W together with carrier gas such as hydrogen gas are silicon material gas (for example, dichlorosilane, trichlorosilane or the like), dopant gas or the like in a case of forming a silicon epitaxial layer, monosilane, ammonia or the like in a case of forming a silicon nitride film, and etching gas such as nitrogen trifluoride ($NF_3$) or chlorine trifluoride ($ClF_3$) in a case of etching. The formation of a thin film such as a silicon epitaxial layer or a silicon nitride film on the front surface of the wafer W and the etching are performed by mixed gas of the reaction gas and the carrier gas. Heating temperature, composition and flow rate of gas to be flown, flow time or the like is appropriately set depending upon processes in view of a property or a thickness of a desired thin film, etching thickness in the case of the etching, or the like.

The preheat ring 3 is positioned as described above to have the predetermined clearances A and C with respect to the susceptor 2 and the pocket 4a of the base 4, and then heat treatment is performed to the wafer W. Thus, even when the preheat ring 3 expands with heat or the susceptor 2 is rotated in heat treatment, the preheat ring 3 does not contact with the susceptor 2, and also the preheat ring 3 surrounds the periphery of the susceptor 2 to be close thereto. Therefore, heat treatment can be preferably performed.

According to the above heat treatment apparatus 100, since the preheat ring 3 is formed in a shape in which the inner peripheral center 31a is eccentric to the outer periphery 32. Thus, even when the center of the susceptor 2 is misaligned to the pocket inner periphery 4aa of the base 4, the predetermined clearance A can be formed between the susceptor 2 and the preheat ring 3 over the whole periphery of the susceptor 2 by positioning the preheat ring 3 placed on the base 4 to minimize the distance between the center of the susceptor 2 and the center of the inner periphery 31 of the preheat ring 3. Accordingly, the preheat ring 3 and the susceptor 2 can be easily adjusted to be close to and in non-contact with each other. Thereby, the time required for adjustment or the like after maintenance of the heat treatment apparatus can be shortened, enabling to improve productivity, which is preferable.

Further, since heat treatment can be performed in a state that the susceptor 2 and the preheat ring 3 are close to and in non-contact with each other, particles generated by the contact of the susceptor 2 with the preheat ring 3 in heat treatment can be reduced, thereby enabling to reduce particles adhering to the wafer W. Consequently, lowering of yield can be suppressed, which is preferable.

Incidentally, this invention is not limited to the above described embodiment.

For example, the support section for supporting the preheat ring may be an arm or the like other than the base, which supports the preheat ring from the lower side at a plurality of points of the rear surface of the preheat ring. Even in such the heat treatment apparatus, in the case that the susceptor is misaligned to the support section of the preheat ring, the preheat ring can be close to and in non-contact with the susceptor over the whole periphery of the susceptor by moving the preheat ring on the support section.

This invention may also be applied to a heat treatment apparatus comprising a susceptor for processing a plurality of wafers W at one time.

Further, in the heat treatment apparatus, a plurality of preheat rings each having a different degree of eccentricity of the inner peripheral center to the outer periphery may be prepared, and a preheat ring which is appropriately selected in view of a degree of misalignment of the center of the susceptor to the support section of the preheat ring may be used.

EMBODIMENT

In this embodiment, vapor phase epitaxial growth was performed to a wafer of 300 mm in diameter by using the heat treatment apparatus 100 in FIG. 1.

The heat treatment apparatus 100 used was such that the diameter of the outer periphery of the susceptor is about 373 mm, the diameter of the pocket inner periphery of the base is about 447 mm, and the center of the susceptor is misaligned by about 1 mm to the inner peripheral center of the base. The preheat ring was formed such that the inner diameter is about 377 mm, the outer diameter is about 443 mm, and the inner peripheral center is eccentric to the outer periphery to make the inner peripheral center be misaligned by 1 mm to the outer peripheral center.

According to the above described embodiment, after placing the preheat ring onto the pocket of the base, the preheat ring was positioned with respect to the pocket inner periphery of the base and the susceptor. In this state, there was a clearance ranging from about 1.5 to 2.5 mm formed between the preheat ring and the susceptor over the whole periphery of the susceptor.

Thereafter, the wafer was placed on the susceptor to perform vapor phase growth of a silicon single crystal thin film. The vapor phase growth was performed such that the wafer was heated to about 1110° C. to 1190° C. by the heating apparatus, and silicon material gas or the like was supplied for a predetermined time into the heat treatment vessel, thereby forming a silicon epitaxial layer of about 3 μm on the front surface of the wafer.

For the wafer on which the silicon epitaxial layer was formed, particles adhered to the front surface of the wafer were detected by a particle counter in which a laser light is used.

Figure 4A:
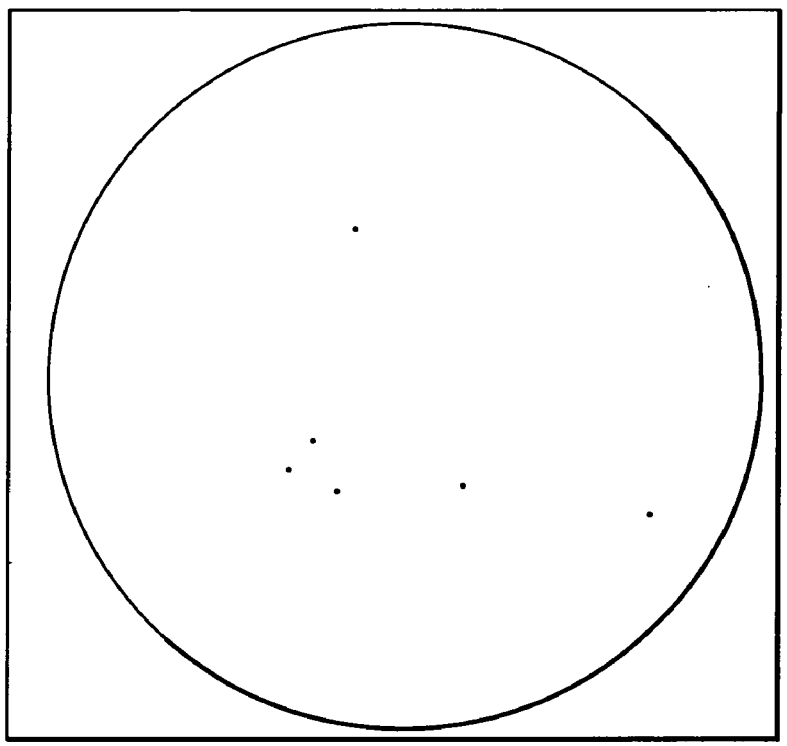
FIG. 4A is a top view showing particles detected on a front surface of a wafer, in a case that vapor phase growth of a thin film is performed on the wafer by using a heat treatment apparatus in which the susceptor does not contact with the preheat ring.

As a result of the particle number detected on the front surface of the wafer, 6 particles having a diameter of 0.12 to 10.0 μm were detected and no particle having a diameter larger than 10 μm was not detected. FIG. 4A shows the particles detected on the wafer.

COMPARATIVE EXAMPLE

In this comparative example, the conventional heat treatment apparatus comprising a preheat ring in which the inner peripheral center corresponds to the outer peripheral center is used to perform vapor phase growth of a silicon single crystal thin film with the condition same as that in the above described embodiment in a state that the preheat ring contacts with the susceptor.

Figure 4B:
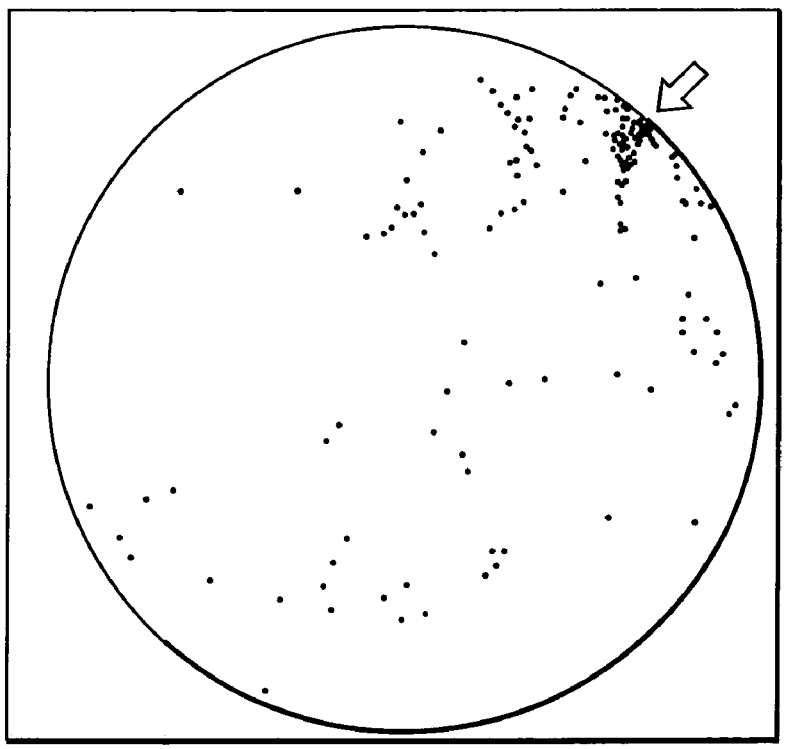
FIG. 4B is a top view showing particles detected on a front surface of a wafer, in a case that vapor phase growth of a thin film is performed on the wafer by using a heat treatment apparatus in which the susceptor contacts with the preheat ring.
Figure 5A:
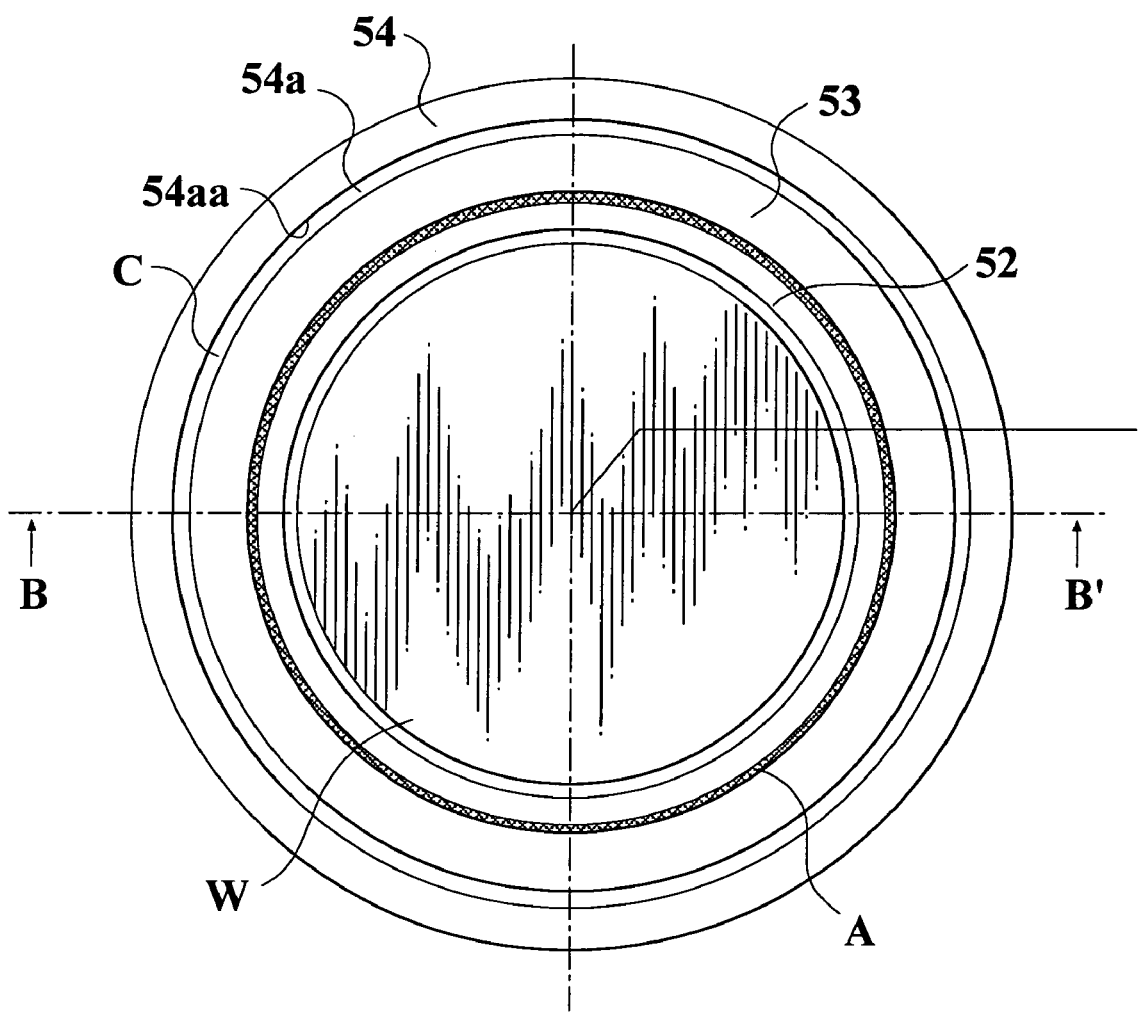
FIG. 5A is a top view showing a state that a center of a susceptor corresponds to centers of a preheat ring and a pocket of a base in a conventional heat treatment apparatus.
Figure 5B:
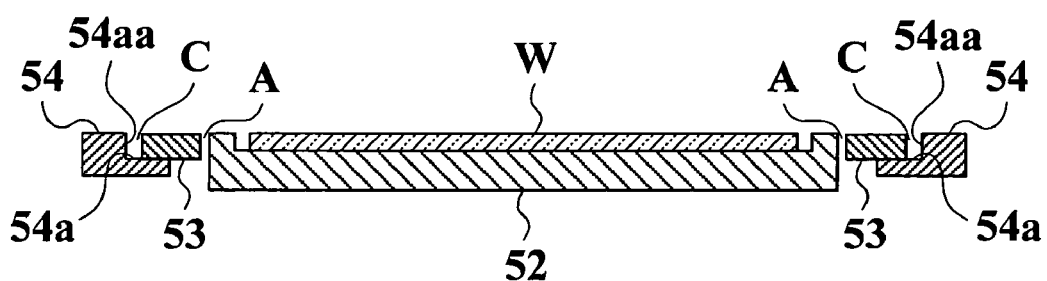
FIG. 5B is a sectional view taken along the line B-B' of FIG. 5A.

For the wafer on which the silicon epitaxial layer was formed, the particle number on the front surface of the wafer was detected in the same manner as the above described embodiment. 183 particles having a diameter of 0.12 to 10.0 μm and 33 particles having a diameter larger than 10.0 μm were detected. FIG. 4B shows the particles detected on the wafer.

Incidentally, in FIG. 4B, a portion around the wafer indicated by an arrow corresponds to a position where the susceptor contacts with the preheat ring.

Comparing the embodiment with the comparative example, it is found out that when the susceptor contacts with the preheat ring, the particle number extremely increases compared to the case where the susceptor does not contact with the preheat ring. Also, many particles were detected at a portion near a contact portion of the susceptor and the preheat ring, so that it is considered that the contact of the susceptor with the preheat ring is significantly involved in generation of particles.

Accordingly, by forming the preheat ring in which the inner peripheral center is eccentric to the outer periphery, and positioning the preheat ring to be close to and in non-contact with the susceptor to thereby perform heat treatment, generation of particles can be significantly reduced. Thus, adhesion of particles to a wafer can be prevented, enabling to suppress lowering of yield, which is preferable.

INDUSTRIAL APPLICATION

According to this invention, even when a center of a susceptor is misaligned to a support section of a preheat ring, a proper clearance can be formed between the susceptor and the preheat ring by moving the preheat ring to minimize the distance between the center of the susceptor and the inner peripheral center of the preheat ring to thereby be supported by the support section, so that the susceptor can be prevented from contacting with the preheat ring.

Also, an outer periphery of the preheat ring can be positioned in a pocket of a base, and even when the susceptor is misaligned to the base, the preheat ring and the susceptor can be easily adjusted not to contact with each other by moving the preheat ring in the base.

Further, heat treatment can be preferably performed to a substrate in a state of suppressing generation of particles by keeping the preheat ring and the susceptor in the non-contact state.

Accordingly, the contact of the susceptor with the preheat ring can be easily prevented, and therefore, it can be prevented that particles are generated to adhere to the substrate, enabling to suppress lowering of yield in heat treatment. Also, since the preheat ring and the susceptor can be easily adjusted, the non-operating time such as for maintenance of a heat treatment apparatus or the like can be shortened, which is preferable. Therefore, the heat treatment apparatus and the heat treatment method of this invention are specially suitable for forming a thin film such as a silicon epitaxial layer, a silicon nitride film or the like on a front surface of a semiconductor substrate such as a silicon single crystal wafer or the like.

What is claimed is:

1. A heat treatment apparatus comprising:
   a susceptor rotatably provided in a heat treatment vessel, on which a substrate is placed;
   a preheat ring surrounding a periphery of the susceptor to be close to and in non-contact with the susceptor, which is supported by a support section provided in the heat treatment vessel; and
   a heating apparatus for heating a substrate placed on the susceptor,
   wherein the preheat ring is formed such that an inner peripheral center of the preheat ring is eccentric to an outer periphery of the preheat ring, and
   the inner peripheral center is misaligned by not less than 1 mm to an outer periphery center of the preheat ring.

2. The heat treatment apparatus as claimed in claim 1, wherein the support section comprises a base on which a pocket for placing the preheat ring is formed.

3. The heat treatment apparatus as claimed in claim 1, wherein the inner peripheral center of the preheat ring corresponds to the center of the susceptor.

4. The heat treatment apparatus as claimed in claim 2, wherein a size of an outer diameter of the preheat ring and a size the pocket of the base are set to form a predetermined clearance between a pocket inner periphery of the base and an outer periphery of the preheat ring.

5. A heat treatment method comprising:
   moving the preheat ring, which is supported by the support section in the heat treatment apparatus as claimed in claim 1, around the susceptor;
   positioning the preheat ring to minimize a distance between the inner peripheral center of the preheat ring and the center of the susceptor;
   thereafter, placing a substrate on the susceptor; and
   performing a heat treatment to the substrate.

6. A heat treatment method comprising:
   moving the preheat ring, which is placed on the base in the heat treatment apparatus as claimed in claim 2, in the pocket;
   positioning the preheat ring to minimize a distance between the inner peripheral center of the preheat ring and the center of the susceptor;
   thereafter, placing a substrate on the susceptor; and
   performing a heat treatment to the substrate.

7. The heat treatment method as claimed in claim 5, wherein after positioning the preheat ring, the substrate placed on the susceptor is subjected to a vapor phase growth of a thin film.

8. The heat treatment method as claimed in claim 6, wherein after positioning the preheat ring, the substrate placed on the susceptor is subjected to a vapor phase growth of a thin film.

* * * * *